(12) United States Patent
Bergendahl et al.

(10) Patent No.: US 11,869,936 B2
(45) Date of Patent: *Jan. 9, 2024

(54) SEMICONDUCTOR DEVICE AND METHOD OF FORMING THE SEMICONDUCTOR DEVICE

(71) Applicant: International Business Machines Corporation, Armonk, NY (US)

(72) Inventors: Marc Adam Bergendahl, Troy, NY (US); Gauri Karve, Cohoes, NY (US); Fee Li Lie, Albany, NY (US); Eric R. Miller, Watervliet, NY (US); Robert Russell Robison, Rexford, NY (US); John Ryan Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 165 days.

This patent is subject to a terminal disclaimer.

(21) Appl. No.: 17/402,507

(22) Filed: Aug. 14, 2021

(65) Prior Publication Data

US 2021/0376078 A1    Dec. 2, 2021

Related U.S. Application Data

(60) Continuation of application No. 16/398,987, filed on Apr. 30, 2019, now Pat. No. 11,127,815, which is a
(Continued)

(51) Int. Cl.
*H01L 21/00* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/0657* (2013.01); *H01L 29/42392* (2013.01); *H01L 29/66742* (2013.01); *H01L 29/78642* (2013.01); *H01L 29/78648* (2013.01); *H01L 29/78696* (2013.01)

(58) Field of Classification Search
CPC .......... H01L 29/0657; H01L 29/42392; H01L 29/66742
See application file for complete search history.

(56) References Cited

U.S. PATENT DOCUMENTS 5,480,838 A * 1/1996 Mitsui ................. H01L 29/7834
257/E29.267
6,355,532 B1  3/2002 Seliskar et al.
(Continued)

FOREIGN PATENT DOCUMENTS

DE    102015112259 A1 *  4/2016  ....... H01L 21/28185

OTHER PUBLICATIONS

U.S. Notice of Allowance dated May 7, 2021 in U.S. Appl. No. 16/398,987.
(Continued)

*Primary Examiner* — Laura M Menz
(74) *Attorney, Agent, or Firm* — Yuanmin Cai

(57) ABSTRACT

A semiconductor device includes a fin structure including a recess formed in an upper surface of the fin structure, an inner gate formed in the recess of the fin structure, and an outer gate formed outside and around the fin structure.

16 Claims, 26 Drawing Sheets

Related U.S. Application Data division of application No. 15/859,362, filed on Dec. 30, 2017, now Pat. No. 10,381,437, which is a division of application No. 15/294,490, filed on Oct. 14, 2016, now Pat. No. 9,917,196.

(56) References Cited

U.S. PATENT DOCUMENTS

| | | | |
|---|---|---|---|
| 7,586,130 B2 | 9/2009 | Kawashima et al. | |
| 8,415,737 B2 | 4/2013 | Brar et al. | |
| 8,476,699 B2 | 7/2013 | Masuoka et al. | |
| 8,525,184 B2 | 9/2013 | Okada et al. | |
| 8,866,266 B2* | 10/2014 | Tekleab | H01L 29/775 257/621 |
| 9,570,169 B1* | 2/2017 | Czornomaz | H10N 70/821 |
| 9,576,979 B2* | 2/2017 | Cheng | H01L 29/66795 |
| 9,608,065 B1* | 3/2017 | Bergendahl | H01L 29/41791 |
| 9,728,622 B1* | 8/2017 | Bergendahl | H01L 29/4916 |
| 9,881,937 B2* | 1/2018 | Cheng | H01L 27/1211 |
| 9,917,196 B1* | 3/2018 | Bergendahl | H01L 29/78642 |
| 10,381,437 B2* | 8/2019 | Bergendahl | H01L 29/78696 |
| 10,566,251 B2* | 2/2020 | Lee | H01L 29/66666 |
| 10,615,278 B2* | 4/2020 | Cheng | H01L 29/7849 |
| 10,720,509 B1* | 7/2020 | Liao | H01L 29/4238 |
| 10,756,175 B2* | 8/2020 | Lee | H01L 21/823864 |
| 11,127,815 B2* | 9/2021 | Bergendahl | H01L 29/78648 |
| 11,177,366 B2* | 11/2021 | Reznicek | H01L 29/161 |
| 11,239,316 B2* | 2/2022 | Bergendahl | H01L 29/66742 |
| 11,245,009 B2* | 2/2022 | Reznicek | H01L 29/66795 |
| 11,515,427 B2* | 11/2022 | Zhao | H01L 21/823885 |
| 2009/0032849 A1* | 2/2009 | Higashino | H01L 29/7827 438/192 |
| 2011/0037145 A1* | 2/2011 | Lee | H01L 28/60 257/532 |
| 2011/0233512 A1 | 9/2011 | Yang et al. | |
| 2012/0217468 A1* | 8/2012 | Tekleab | B82Y 10/00 438/270 |
| 2015/0041921 A1* | 2/2015 | Choi | H01L 29/7853 438/283 |
| 2015/0129961 A1* | 5/2015 | Li | H01L 21/823475 438/587 |
| 2015/0162439 A1* | 6/2015 | Hoentschel | H01L 29/66659 257/77 |
| 2015/0311255 A1 | 10/2015 | Park | |
| 2016/0042960 A1 | 2/2016 | Kim et al. | |
| 2016/0056295 A1* | 2/2016 | Wen | H01L 29/7853 257/369 |
| 2016/0163819 A1* | 6/2016 | Liou | H01L 21/28518 257/618 |
| 2016/0351590 A1* | 12/2016 | Cheng | H01L 29/66795 |
| 2017/0117300 A1* | 4/2017 | Cheng | H01L 21/845 |
| 2018/0069027 A1* | 3/2018 | Cheng | H01L 29/161 |
| 2018/0122947 A1* | 5/2018 | Bergendahl | H01L 29/78642 |
| 2019/0259832 A1* | 8/2019 | Bergendahl | H01L 29/66742 |
| 2019/0259833 A1* | 8/2019 | Bergendahl | H01L 29/66742 |
| 2020/0411682 A1* | 12/2020 | Rahman | H01L 21/823431 |
| 2021/0376078 A1* | 12/2021 | Bergendahl | H01L 29/78696 |
| 2022/0045193 A1* | 2/2022 | Xie | H01L 27/088 |
| 2022/0140074 A1* | 5/2022 | Bergendahl | H01L 29/42392 257/401 |
| 2023/0065078 A1* | 3/2023 | Mignot | H01L 21/76808 |
| 2023/0072062 A1* | 3/2023 | Miller | A47J 45/063 |

OTHER PUBLICATIONS

U.S. Office Action dated Jan. 22, 2021 in U.S. Appl. No. 16/398,987.
U.S. Office Action dated Aug. 5, 2020 in U.S. Appl. No. 16/398,987.
U.S. Office Action dated May 25, 2021 in U.S. Appl. No. 16/398,999.
U.S. Office Action dated Aug. 7, 2020, in co-pending U.S. Appl. No. 16/398,999.
U.S. Office Action dated Feb. 16, 2021, in co-pending U.S. Appl. No. 16/398,999.
A Non-Final Office Action, dated Mar. 28, 2023 in U.S. Appl. No. 17/578,891.

* cited by examiner

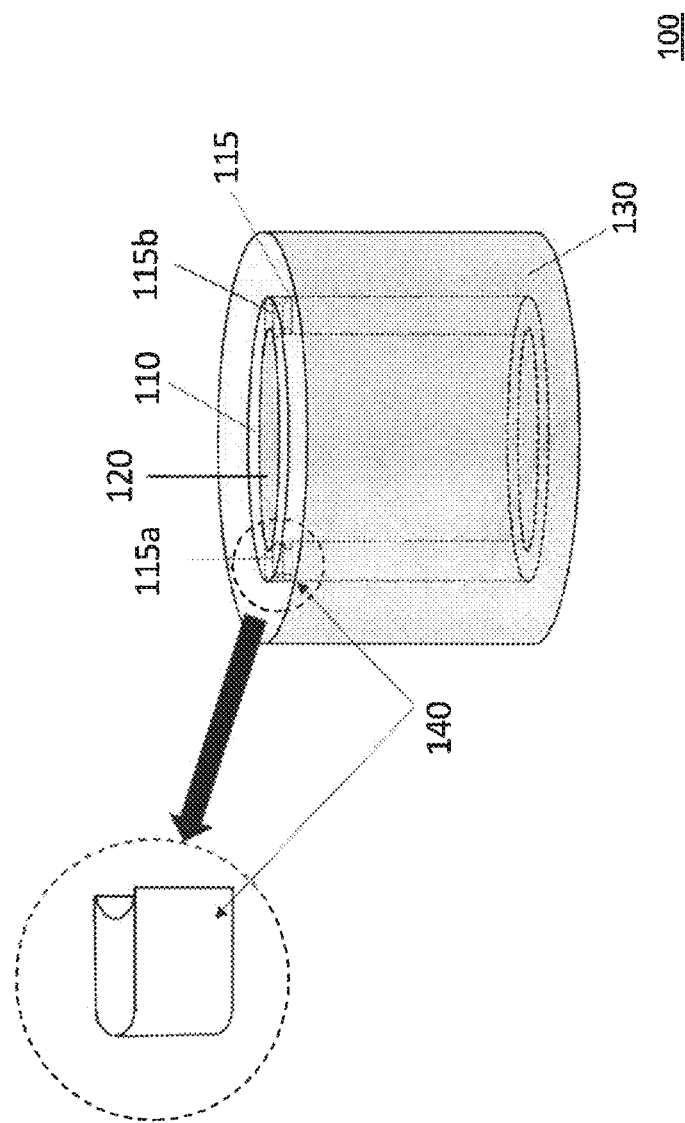

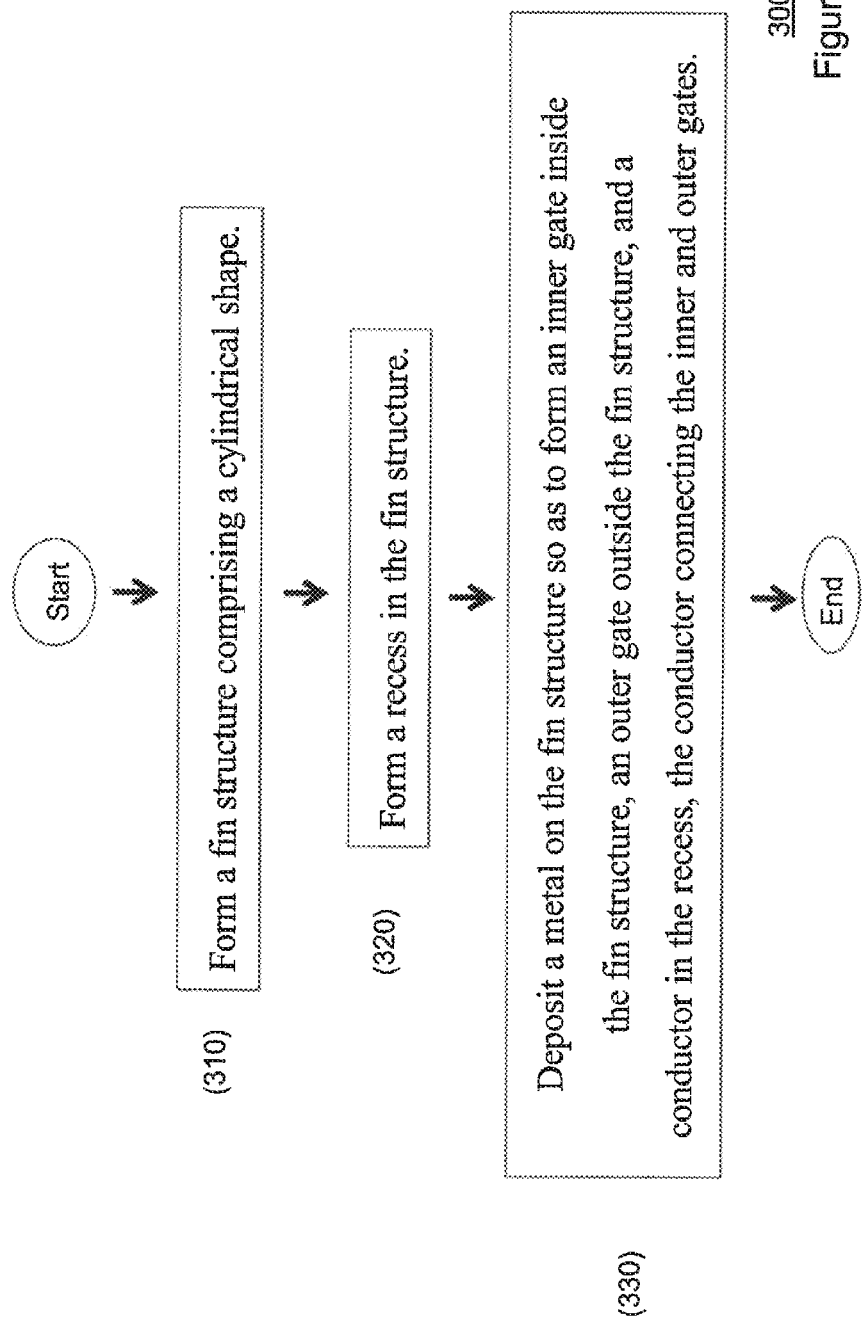

400

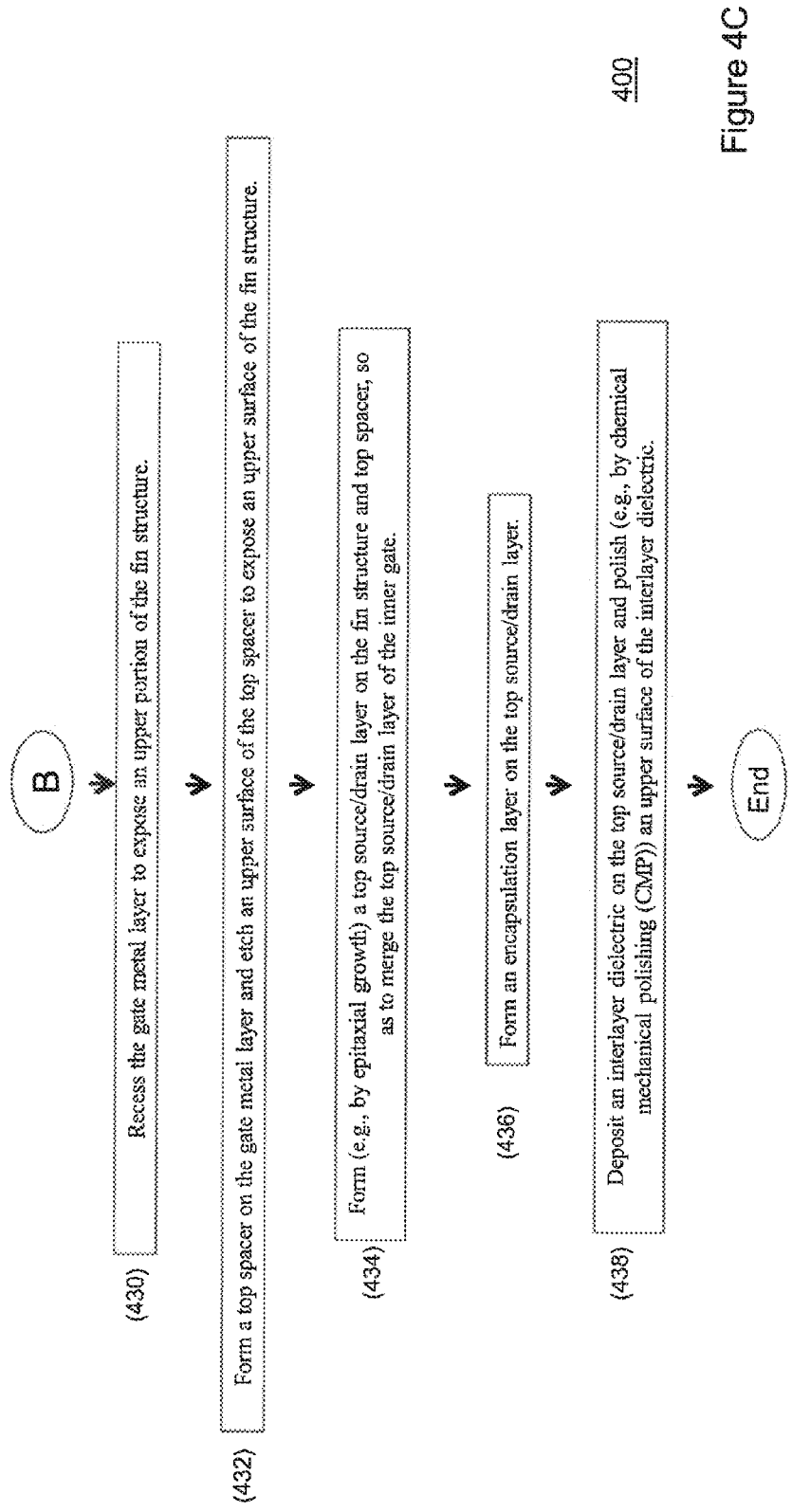

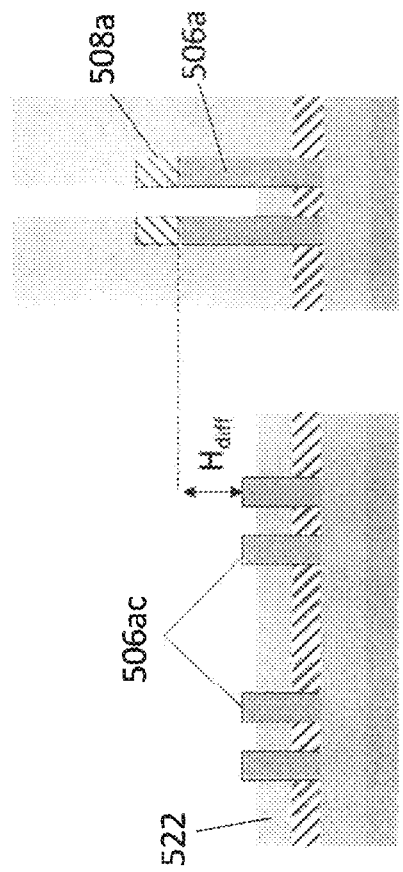
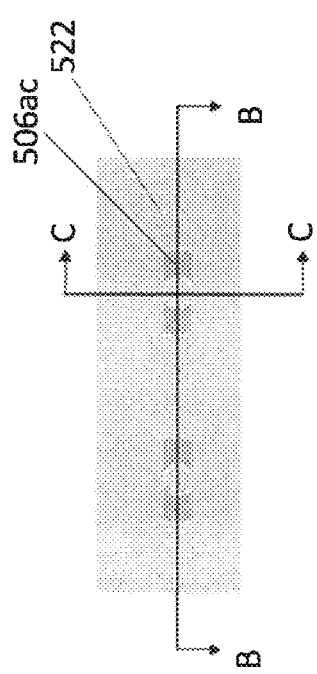
Figure 15C
Figure 15B
Figure 15A

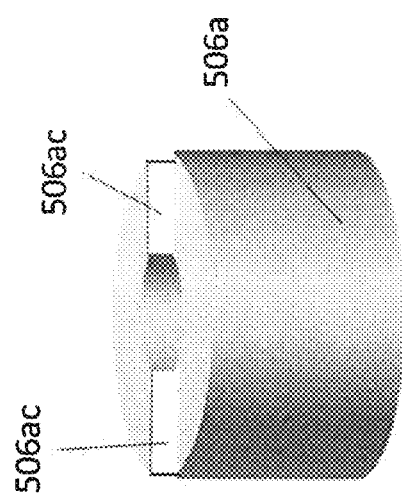

SEMICONDUCTOR DEVICE AND METHOD OF FORMING THE SEMICONDUCTOR DEVICE

The present Application is a Continuation Application of U.S. patent application Ser. No. 16/398,987, which was filed on Apr. 30, 2019, which is a Divisional Application of U.S. patent application Ser. No. 15/859,362, now U.S. Pat. No. 10,381,437 B1, which was filed on Dec. 30, 2017, which is a Divisional Application of U.S. patent application Ser. No. 15/294,490, filed on Oct. 14, 2016, now U.S. Pat. No. 9,917,196 B1.

BACKGROUND

The present invention relates generally to a semiconductor device and a method of forming the semiconductor device and, more particularly, to a semiconductor device which includes a fin structure having a cylindrical shape, and a conductor formed in a recess of the fin structure and connecting inner and outer gates of the device.

A related art cylindrical field effect transistor (FET) includes an inner gate and a contact connected to the inner gate for controlling the inner gate, and an outer gate and a contact connected to the outer gate for controlling the outer gate.

SUMMARY

An exemplary aspect of the present invention is directed to a semiconductor device including a fin structure including a cylindrical shape and including a recess formed in an upper surface of the fin structure, an inner gate formed inside the fin structure, an outer gate formed outside the fin structure, and a conductor formed in the recess and connecting the inner and outer gates.

Another exemplary aspect of the present invention is directed to a method of forming a semiconductor device. The method includes forming a fin structure including a cylindrical shape, forming a recess in the fin structure, and depositing a metal on the fin structure, so as to form an inner gate inside the fin structure, an outer gate outside the fin structure, and a conductor in the recess, the conductor connecting the inner and outer gates.

Another exemplary aspect of the present invention is directed to a semiconductor device including a fin structure including a circular cylindrical shape. The fin structure includes a first recess formed on a first side of the fin structure, and a second recess formed on a second side of the fin structure opposite the first side. The device further includes an inner gate formed inside the fin structure, and an inner gate insulating layer formed between the inner gate and an inner surface of the fin structure, an outer gate formed outside the fin structure, and an outer gate insulating layer formed between the outer gate and an outer surface of the fin structure, and first and second conductive bars formed in the first and second recesses, respectively, each of the first and second conductive bars connecting the inner and outer gates, a height of the first and second conductive bars being substantially equal to the depth of the recess, such that an upper surface of the first and second conductive bars is substantially co-planar with an upper surface of the fin structure, and each of the first and second conductive bars including a first end connected to an outer surface of the inner gate and a second end connected to an inner surface of the outer gate.

With its unique and novel features, the exemplary aspects of the present invention may provide a merging of the inner and outer gates, and eliminate the need for separate contacts for the inner and outer gates.

BRIEF DESCRIPTION OF THE DRAWINGS

The exemplary aspects of the present invention will be better understood from the following detailed description of the exemplary embodiments of the invention with reference to the drawings, in which:

FIG. 1 illustrates a semiconductor device 100 (e.g., vertical field effect transistor (VFET) including a cylindrical fin structure), according to an exemplary aspect of the present invention.

FIG. 3 illustrates a method 300 of forming a semiconductor device (e.g., the semiconductor device 100), according to an exemplary aspect of the present invention.

FIG. 4C illustrates a third part of the method 400, according to an exemplary aspect of the present invention.

FIG. 15A illustrates a top view of the forming of a cut portion 506ac of the fin structure 506a in an upper surface of the fin structure 506a, according to an exemplary aspect of the present invention.

FIG. 15B illustrates a side view of the forming of a cut portion 506ac in an upper surface of the fin structure 506a along line B-B in FIG. 15A, according to an exemplary aspect of the present invention.

FIG. 15C illustrates a side view of the forming of a cut portion 506ac in an upper surface of the fin structure 506a along line C-C in FIG. 15A, according to an exemplary aspect of the present invention.

FIG. 17 illustrates the resulting fin structure 506a, according to an exemplary aspect of the present invention.

DETAILED DESCRIPTION

Figure 2B:
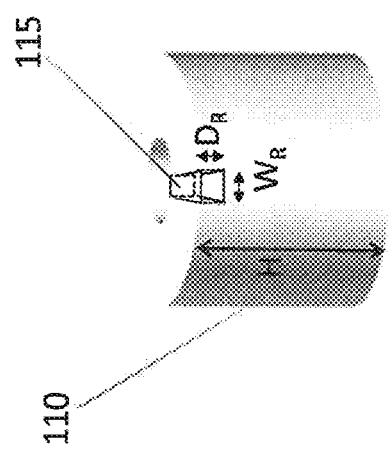
FIGS. 2A and 2B illustrate the fin structure 110, according to an exemplary aspect of the present invention.

The invention will now be described with reference to FIGS. 1-24C in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

A problem with related art devices is that they require separate contacts for the inner and outer gates. An exemplary aspect of the present invention may provide a merging of the inner and outer gates, and eliminate the need to form separate contacts for the inner and outer gates, thus saving time and money.

FIG. 1 illustrates a semiconductor device 100 (e.g., vertical field effect transistor (VFET) including a cylindrical fin structure), according to an exemplary aspect of the present invention.

As illustrated in FIG. 1, the semiconductor device 100 includes a fin structure 110 including a cylindrical shape and including a recess 115 formed in an upper surface of the fin structure 110, an inner gate 120 formed inside the fin structure 110, an outer gate 130 formed outside the fin structure 110, and a conductor 140 formed in the recess 115 and connecting the inner and outer gates 120, 130.

As illustrated in FIG. 1, the recess 115 may include a first recess portion 115a formed on a first side of the fin structure 110 and a second recess portion 115b formed on a second side of the fin structure 110 opposite the first side. In this case, the conductor 110 may be formed in the first and second recess portions 115a, 115b.

Each of the conductor 140, inner gate 120 and outer gate 130 may include a conductive material such as, for example, titanium, tantalum, tungsten, TiN, TaN, $WN_x$, poly silicon, or the like. The conductor 140 may be formed of the same material as the inner gate 120 and/or the outer gate 130.

The conductor 140 may also be integrally formed with the inner gate 120 and/or the outer gate 130. In particular, the conductor 140 may be formed from the same metal layer used to form the inner and outer gates 120, 130 and may form a continuous "bridge" between the inner and outer gates 120, 130.

As illustrated in FIG. 1, the inner and outer gates 120, 130 may also have a cylindrical shape. The cylindrical shape of the fin structure 110 and the inner and outer gates 120, 130 may include a circular cylindrical shape, although other cylindrical shapes (e.g., oval cylindrical, etc.) may be used.

The conductor 140 may be formed, for example, as a conductive bar and may extend radially across the fin structure 110 from an inner surface of the fin structure 110 to an outer surface of the fin structure. The conductor 140 may include a first end connected to an outer surface of the inner gate 120 and a second end connected to an inner surface of the outer gate 130.

Further, an inner gate insulating layer may be formed between the inner gate 120 and the inner surface of the fin structure 110, and an outer gate insulating layer may be formed between the outer gate 130 and the outer surface of the fin structure 110.

The conductor 140 may have a shape corresponding to a shape of the recess 115 in the upper surface of the fin structure 115. Thus, for example, the recess 115 may have a substantially rectangular cross-sectional shape and the conductor 140 may also include a substantially rectangular cross-sectional shape. Other cross-sectional shapes (e.g., circular cross-section, square cross-section) may also be used for the recess 115 and the conductor 140.

The area of the cross-section of the conductor 140 should be great enough to ensure a sufficient electrical connection between the inner and outer gates 120, 130.

Figure 2A:
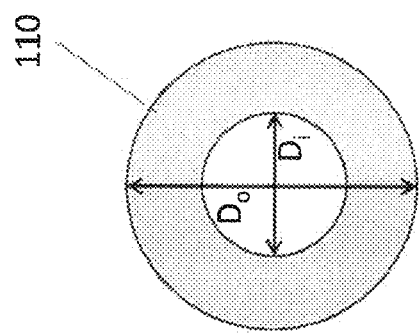

FIGS. 2A and 2B illustrate the fin structure 110, according to an exemplary aspect of the present invention.

In particular, FIG. 2A illustrates a top view of the fin structure 110, according to an exemplary aspect of the present invention.

As illustrated in FIG. 2A, the a diameter Di of the inner surface of the fin structure 110 may be in a range from 10 nm to 30 nm, a diameter Do of the outer surface of the fin structure 110 may be in a range from 30 nm to 50 nm, and a width W of the fin structure 110 between the inner surface and the outer surface may be in a range from 5 nm to 15 nm. The diameter Do should be large enough to allow room to form a gate insulating layer (e.g., high-k dielectric layer), a layer of work function metal (WFM) and a layer of gate metal inside the fin structure 110. For example, a total thickness of the WFM layer and the gate insulating layer as measured in a direction perpendicular to the inner surface of the fin structure 110, may be in a range from 6 nm to 7 nm.

FIG. 2B illustrates a side view of the fin structure 110, according to an exemplary aspect of the present invention.

As illustrated in FIG. 2B, a height H of the fin structure 110 may be greater than a total of the gate length (Lgate) (e.g., see FIG. 24C) and thickness of the top spacer. In particular, the height H may be in a range from 20 nm to 100 nm.

A depth $D_R$ of the recess 115 should land within $L_{gate}$ to ensure gate merge, and may be dependent, for example, on the height H of the fin structure 110 and $L_{gate}$. For example, the depth $D_R$ of the recess 115 may be in a range from 1 nm to 20 nm. In particular, the depth $D_R$ of the recess 115 may be in a range from 5% to 25% of the height H of the fin structure 110.

A width $W_R$ of the recess 115 (e.g., as measured in a circumferential direction around the outer surface of the fin structure 110) may be selected, for example, so as to ensure that at least one-half of the inside of the fin structure 110 (i.e., where the inner gate 120 is formed) is overlapped with overlay error. In particular, the width $W_R$ may in a range from 10 nm to 30 nm.

A thickness of the conductor 140 as measured in the axial direction of the fin structure 110 may be is substantially equal to the depth of the recess, such that an upper surface of the conductor is substantially co-planar with an upper surface of the fin structure. The area of the conductor 140 may substantially equal to the area ($D_R \times W_R$) and, therefore, the depth $D_R$ and width $W_R$ of the recess 115 may be set to provide a sufficient electrical connection between the inner and outer gates 120, 130.

In a particular exemplary embodiment, the diameter Di is about 20 nm, the diameter Do is about 40 nm, the width W is about 10 nm, and the height H of the fin structure 110 is about 60 nm.

It should be noted that although the upper surfaces of the fin structure 110 and the inner and outer gate 120, 130 are illustrate in FIGS. 1 and 2B as being co-planar, this is not necessary. For example, the fin structure 110 may extend upward beyond the upper surfaces of the inner and outer gates 120, 130, so long as at least a bottom portion of the recess 115 (and, therefore, the conductor 140) is formed between the inner and outer gates 120, 130.

Referring again to the drawings, FIG. 3 illustrates a method 300 of forming a semiconductor device (e.g., the semiconductor device 100), according to an exemplary aspect of the present invention.

As illustrated in FIG. 3, the method 300 includes forming (310) a fin structure comprising a cylindrical shape, forming (320) a recess in the fin structure, and depositing (320) a metal on the fin structure so as to form an inner gate inside the fin structure, an outer gate outside the fin structure, and a conductor in the recess, the conductor connecting the inner and outer gates.

Figure 4A:
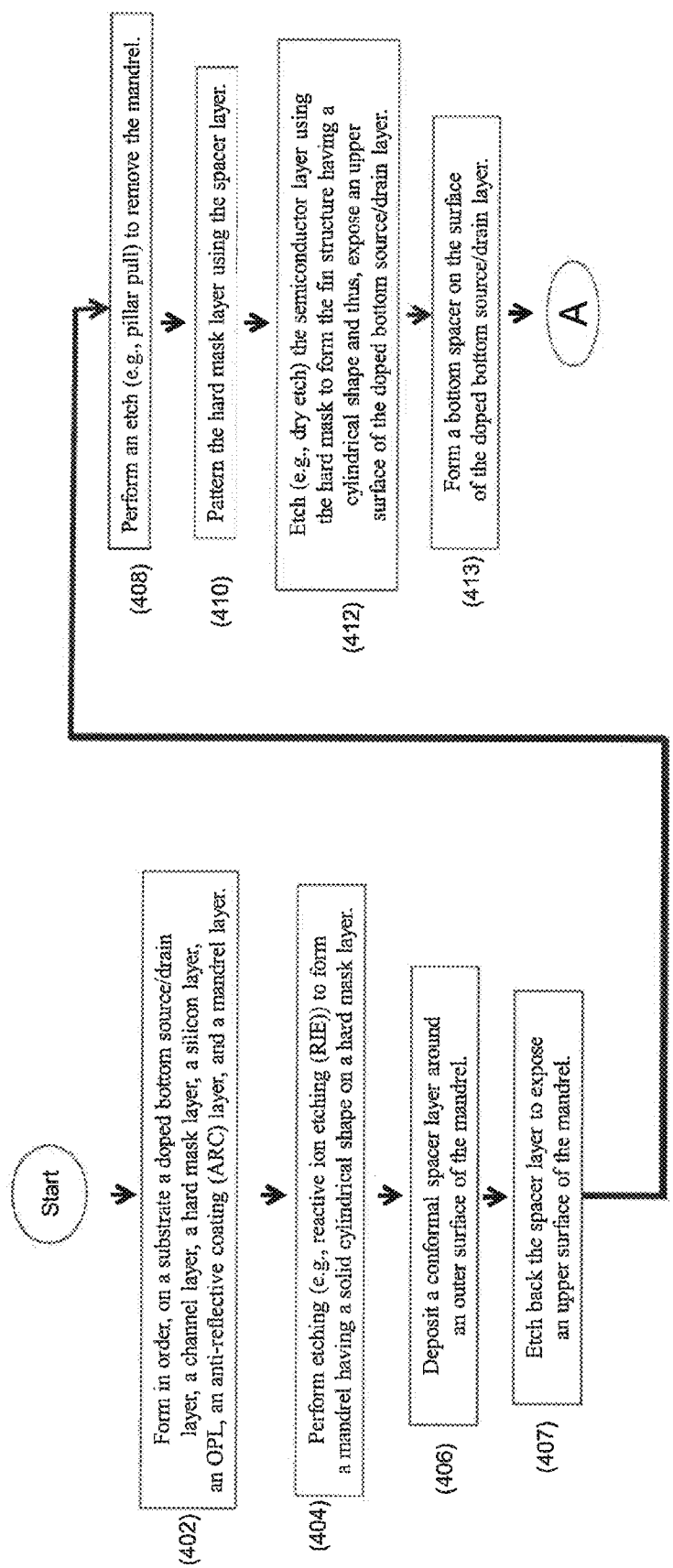
FIG. 4A illustrates a first part of the method 400, according to an exemplary aspect of the present invention.
Figure 4B:
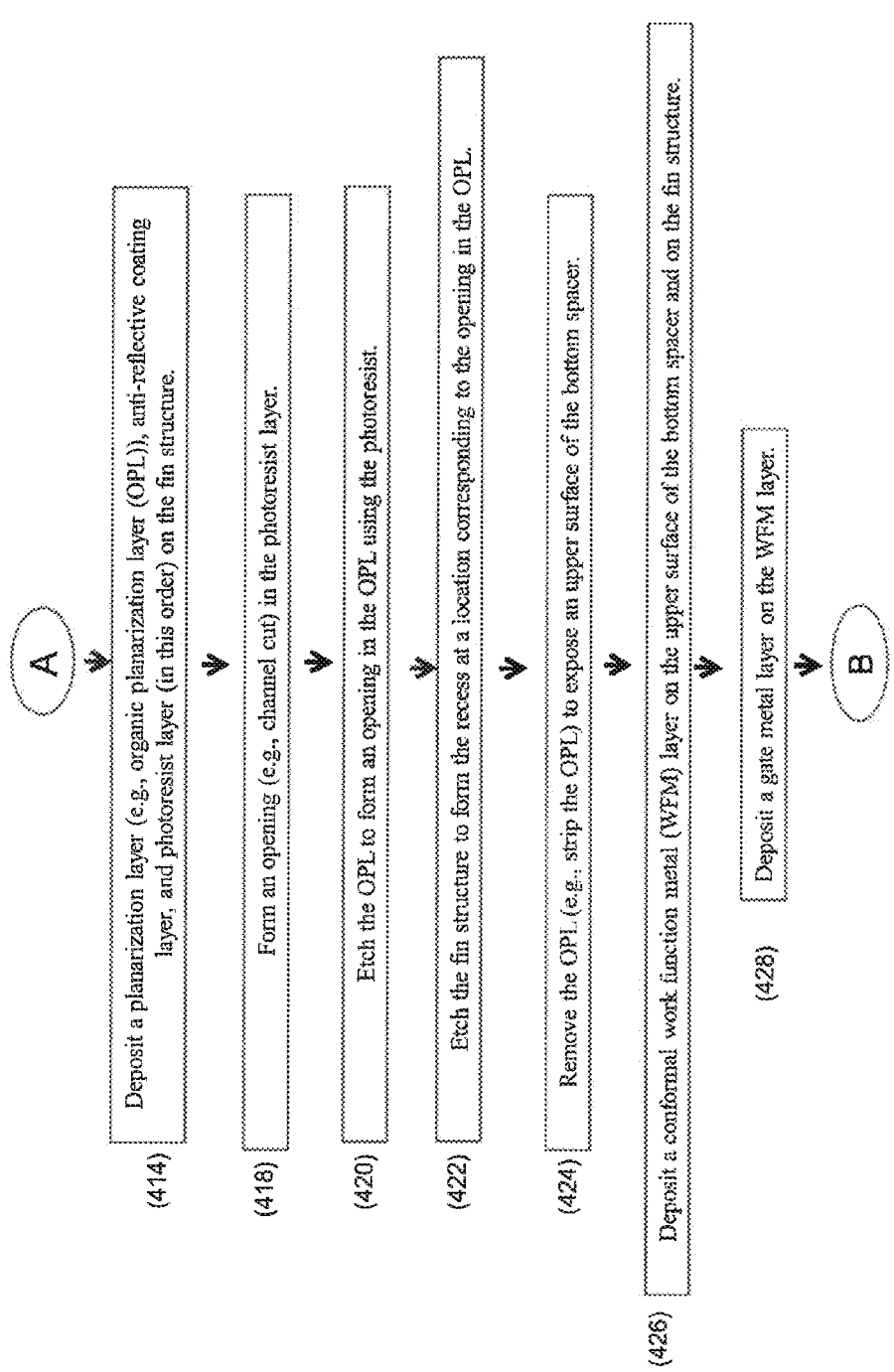
FIG. 4B illustrates a second part of the method 400, according to an exemplary aspect of the present invention.

FIGS. 4A-4C illustrate a method 400 according to an exemplary aspect of the present invention. In particular, FIG. 4A illustrates a first part of the method 400, according to an exemplary aspect of the present invention. FIG. 4B illustrates a second part of the method 400, according to an exemplary aspect of the present invention. FIG. 4C illustrates a third part of the method 400, according to an exemplary aspect of the present invention.

As illustrated in FIG. 4A, the method 400 includes forming (402), in order, on a substrate (e.g., semiconductor substrate) a doped bottom source/drain layer, a channel layer (e.g., a doped semiconductor layer which will later be formed into a cylindrical-shaped fin structure), a hard mask layer (e.g., SiOx, SiN, etc.), an amorphous silicon layer, an OPL, an anti-reflective coating (ARC) layer (e.g., SiARC layer), and a mandrel layer. The mandrel layer could be formed, for example, of an organic material, SiN, SiOx, amorphous silicon, etc.

The method also includes performing (404) reactive ion etching (RIE) to etch the mandrel layer and form a mandrel (e.g., amorphous silicon) including a solid cylindrical shape on the hard mask layer, depositing (406) a conformal spacer layer around an outer surface of the mandrel, etching back (407) the spacer layer to expose an upper surface of the mandrel, performing (408) an etch (e.g., pillar pull) to remove the mandrel, patterning (410) the hard mask layer using the spacer layer, etching (412) (e.g., dry etching) the semiconductor layer using the hard mask to form the fin structure having a cylindrical shape and thus, exposing an upper surface of the doped bottom source/drain layer, and forming (413) a bottom spacer on the surface of the doped bottom source/drain layer.

As illustrated in FIG. 4B, the method 400 also includes depositing (414) a planarization layer (e.g., organic planarization layer (OPL)), anti-reflective coating layer, and photoresist layer (in this order) on the fin structure, forming (418) an opening (e.g., channel cut) in the photoresist layer, etching (420) the OPL to form an opening in the OPL using the photoresist, etching (422) the fin structure to form the recess at a location corresponding to the opening in the OPL, removing (424) the OPL (e.g., stripping the OPL) to expose an upper surface of the bottom spacer, depositing (426) a conformal work function metal (WFM) layer on the upper surface of the bottom spacer and on the fin structure, and depositing (428) a gate metal layer on the WFM layer.

As illustrated in FIG. 4C, the method 400 further includes recessing (430) the gate metal layer to expose an upper portion of the fin structure, forming (432) a top spacer on the gate metal layer and etching an upper surface of the top spacer to expose an upper surface of the fin structure, forming (434) (e.g., by epitaxial growth) a top source/drain layer on the fin structure and top spacer, so as to merge the top source/drain layer of the inner gate, forming (436) an encapsulation layer on the top source/drain layer, and depositing (438) an interlayer dielectric on the top source/drain layer and polishing (e.g., by chemical mechanical polishing (CMP)) an upper surface of the interlayer dielectric.

FIGS. 5A-27C illustrate a method of forming a semiconductor device (e.g., the semiconductor device 100), according to an exemplary aspect of the present invention.

Figure 5B:
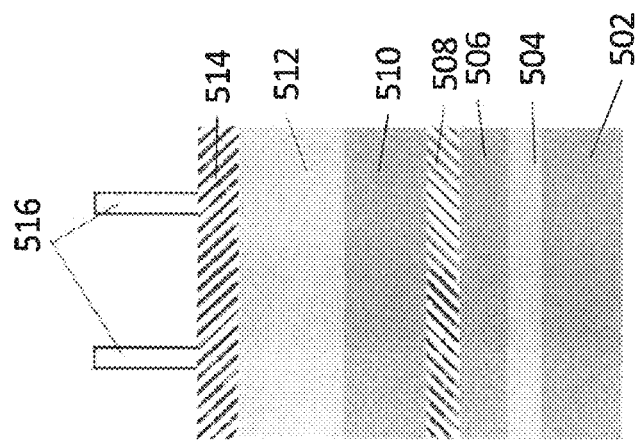
FIG. 5B illustrates a side view of the forming of the pillar 516 along line B-B in FIG. 5A, according to an exemplary aspect of the present invention.
Figure 5A:
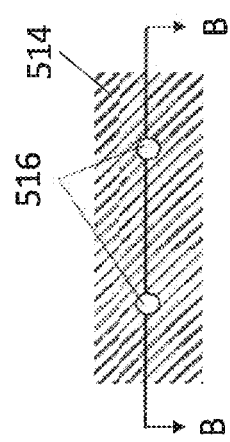
FIG. 5A illustrates a top view of the forming (e.g., by lithography) of a pillar 516, according to an exemplary aspect of the present invention.

In particular, FIG. 5A illustrates a top view of the forming (e.g., by lithography) of a pillar 516, according to an exemplary aspect of the present invention. FIG. 5B illustrates a side view of the forming of the pillar 516 along line B-B in FIG. 5A, according to an exemplary aspect of the present invention.

Unless otherwise indicated, the "forming" or "depositing" of any layer described herein may be understood to include one or more suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The "etching" or "removing" of a layer may be performed by one or more of wet etching, dry etching and reactive ion etching (RIE). Further, the "patterning" of a layer may include, for example, a lithographic patterning and etching process such as reactive ion etching (RIE), sidewall imaging transfer (SIT), self-aligned double patterning (SADP), and self-aligned quadruple patterning (SAQP).

Referring again to FIG. 5B, a substrate 502 is provided. The substrate 502 may include, for example, silicon, strained silicon, silicon carbide, geranium, silicon germanium, silicon-germanium-carbon, Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. The substrate 502 may also include semiconductor-on-insulator (SOI) substrates with buried oxide (BOX) layers. The substrate 502 may also include one or more semiconductor materials in one or more layers.

Formed (in order) on the substrate 502 is a doped bottom source/drain layer 504 (e.g., a doped portion of the substrate 502), and a channel layer 506. The channel layer 506 may be formed of the same materials as the substrate 502, and will later be patterned into a cylindrical-shaped fin structure. Thus, a thickness of the channel layer 506 may be substantially equal to a desired height H of the fin structure 110 (see FIG. 2B).

A hard mask layer 508 (e.g., SiN) may be formed on the channel layer 506. The hard mask layer 508 may include, for example, silicon oxide, silicon nitride, or any combination thereof.

On the hard mask layer 508 may be formed (in order) an amorphous silicon layer 510, an OPL layer 512, an anti-reflective coating layer 514, and a mandrel 516 which may be patterned from an amorphous silicon layer.

Figure 6B:
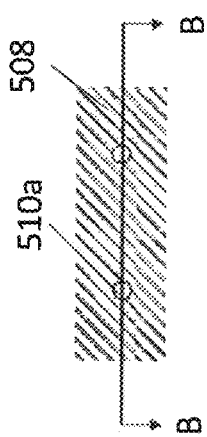
FIG. 6B illustrates a side view of the forming of the mandrel 510a along line B-B in FIG. 6A, according to an exemplary aspect of the present invention.
Figure 6A:
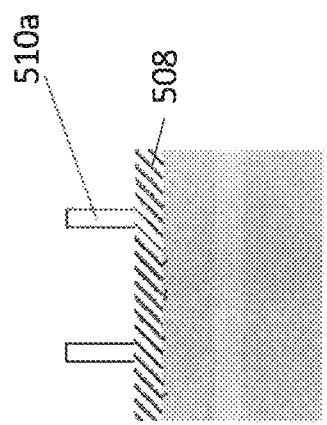
FIG. 6A illustrates a top view of the forming of a mandrel 510a, according to an exemplary aspect of the present invention.

FIG. 6A illustrates a top view of the forming of a mandrel 510a (e.g., amorphous silicon mandrel), according to an exemplary aspect of the present invention. FIG. 6B illustrates a side view of the forming of the mandrel 510a along line B-B in FIG. 6A, according to an exemplary aspect of the present invention.

As illustrated in FIG. 6B, the amorphous silicon layer 510 may be etched (e.g., by RIE) to form a mandrel 510a having a solid cylindrical shape on the hard mask layer 508. Although two mandrels 510a are illustrated in FIG. 6B, any number of mandrels 510a. A cross-section of the mandrel 510a should have a diameter which is substantially equal to a desired inner diameter Di of the fin structure 110 (see FIG. 2A).

Figure 7B:
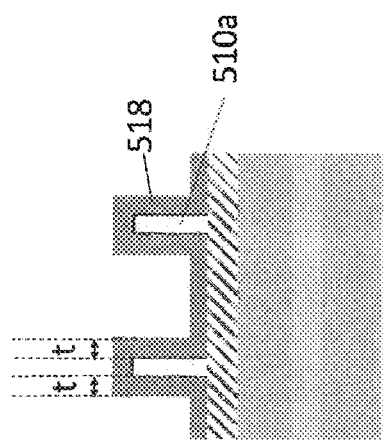
FIG. 7B illustrates a side view of the forming of the spacer layer 518 along line B-B in FIG. 7A, according to an exemplary aspect of the present invention.
Figure 7A:
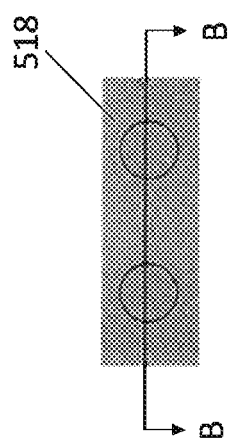
FIG. 7A illustrates a top view of the forming of a spacer layer 518 according to an exemplary aspect of the present invention.

FIG. 7A illustrates a top view of the forming of a spacer layer 518 according to an exemplary aspect of the present invention. FIG. 7B illustrates a side view of the forming of the spacer layer 518 along line B-B in FIG. 7A, according to an exemplary aspect of the present invention.

As illustrated in FIG. 7B, the spacer layer 518 may be conformally formed on the mandrel 510a. The spacer layer 518 may have a thickness tin a radial direction of the cylindrical-shaped mandrel 510a, that is substantially equal to a desired width W of the fin structure 110, and an outer diameter of the spacer layer 518 may be substantially equal to a desired outer diameter Do of the fin structure 110 (see FIG. 2A). The spacer layer 518 may include, for example, dielectric oxides (e.g., silicon oxide), dielectric nitrides (e.g., silicon nitride), dielectric oxynitrides, or any combination thereof.

Figure 8B:
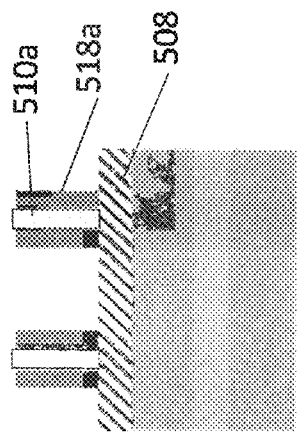
FIG. 8B illustrates a side view of the etch back of the spacer layer 518 along line B-B in FIG. 8A, according to an exemplary aspect of the present invention.
Figure 8A:
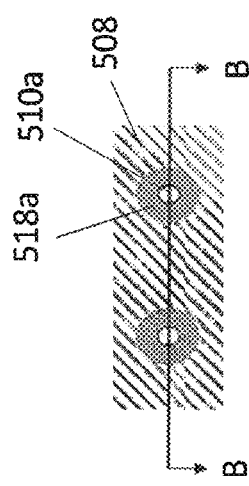
FIG. 8A illustrates a top view of the etch back of the spacer layer 518, according to an exemplary aspect of the present invention.

FIG. 8A illustrates a top view of the etch back of the spacer layer 518, according to an exemplary aspect of the present invention. FIG. 8B illustrates a side view of the etch back of the spacer layer 518 along line B-B in FIG. 8A, according to an exemplary aspect of the present invention.

As illustrated in FIG. 8B, the spacer layer 518 may be etched back to form a spacer layer portion 518a having a hollow cylinder shape, and to expose an upper surface of the mandrel 510a and expose an upper surface of the hard mask layer 508.

Figure 9B:
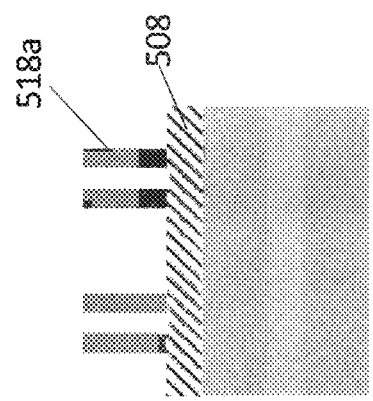
FIG. 9B illustrates the removal of the mandrel 510a along line B-B in FIG. 9A, according to an exemplary aspect of the present invention.
Figure 9A:
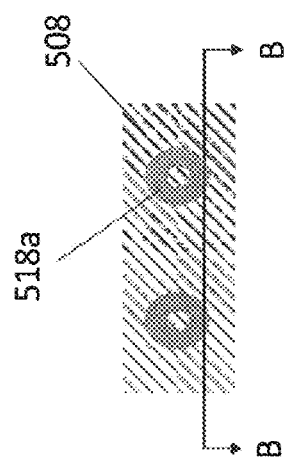
FIG. 9A illustrates a removal of the mandrel 510a, according to an exemplary aspect of the present invention.

FIG. 9A illustrates a removal of the mandrel 510a, according to an exemplary aspect of the present invention. FIG. 9B illustrates the removal of the mandrel 510a along line B-B in FIG. 9A, according to an exemplary aspect of the present invention.

As illustrated in FIG. 9B, the mandrel 510a may be removed to leave the spacer layer portion 518a having a hollow cylinder shape.

Figure 10B:
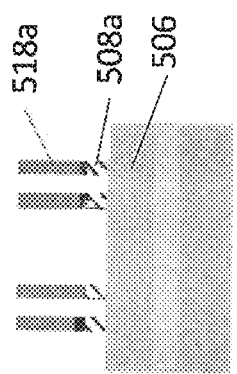
FIG. 10B illustrates a side view of the etching of the hard mask layer 508 along line B-B in FIG. 10A, according to an exemplary aspect of the present invention.
Figure 10A:
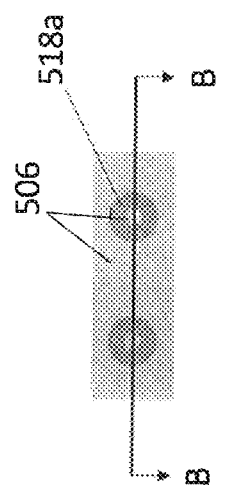
FIG. 10A illustrates a top view of the etching of the hard mask layer 508, according to an exemplary aspect of the present invention.

FIG. 10A illustrates a top view of the etching of the hard mask layer 508, according to an exemplary aspect of the present invention. FIG. 10B illustrates a side view of the etching of the hard mask layer 508 along line B-B in FIG. 10A, according to an exemplary aspect of the present invention.

As illustrated in FIG. 10B, the hard mask layer 508 may be etched (e.g., using the spacer layer portion 518a as a mask) to form a cylindrical shaped hard mask portion 508a that is substantially aligned with the spacer layer portion 518a having a hollow cylinder shape. In addition, the etching of the hard mask layer 508 may expose an upper surface of the channel layer 506.

Figure 11B:
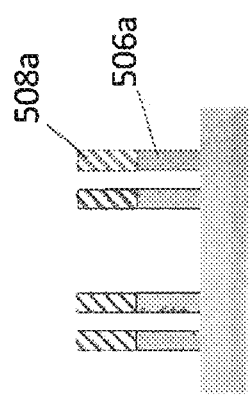
FIG. 11B illustrates a side view of the etching of the channel layer 506 along line B-B in FIG. 11A, according to an exemplary aspect of the present invention.
Figure 11A:
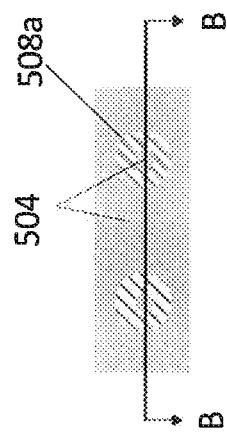
FIG. 11A illustrates a top view of the etching of the channel layer 506, according to an exemplary aspect of the present invention.

FIG. 11A illustrates a top view of the etching of the channel layer 506, according to an exemplary aspect of the present invention. FIG. 11B illustrates a side view of the etching of the channel layer 506 along line B-B in FIG. 11A, according to an exemplary aspect of the present invention.

As illustrated in FIG. 11B, the etching may remove the spacer layer portion 518a on the hard mask portion 508a, and may further etch the channel layer 506 so as to form a fin structure 506a. The etching may also expose an upper surface of the doped bottom source/drain layer 504.

The fin structure 506a may have the dimensions (e.g., inner diameter Di, outer diameter Do width W and height H) described above with respect to the fin structure 110 illustrated in FIGS. 2A-2B.

Figure 12:
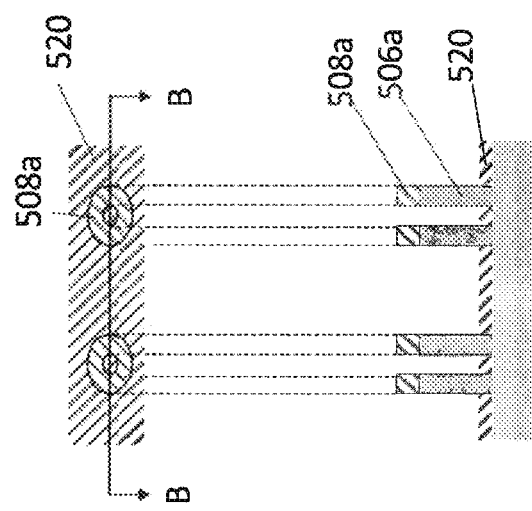
FIG. 12 illustrates a forming of a bottom spacer 520, according to an exemplary aspect of the present invention.

FIG. 12 illustrates a forming of a bottom spacer 520, according to an exemplary aspect of the present invention. The top portion of FIG. 12 is a top view of the bottom spacer 520 and the bottom portion of FIG. 12 is a side view of the bottom spacer 520 along cross-section B-B. The bottom spacer 520 may include, for example, dielectric oxides (e.g., silicon oxide), dielectric nitrides (e.g., silicon nitride), dielectric oxynitrides, or any combination thereof, and may have a thickness in a range from 5 nm to 30 nm.

It should be noted that instead of earlier forming the bottom source/drain layer 504, the bottom source/drain layer 504 could be formed at this point by implanting dopant ions into the substrate 502. In such case, an asymmetry of dopant concentration in the bottom source/drain layer 504 would depend on a dimension of the inner space of the fin structure 506a (e.g., the inner diameter of the fin structure 506a).

Figure 13C:
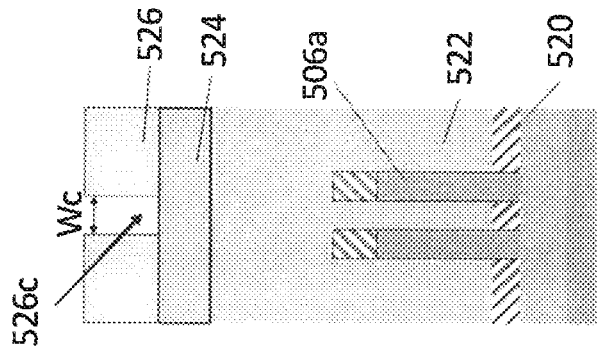
FIG. 13C illustrates a side view of the forming of a cut portion 526c in a photoresist layer 526 along line C-C in FIG. 13A, according to an exemplary aspect of the present invention.
Figure 13B:
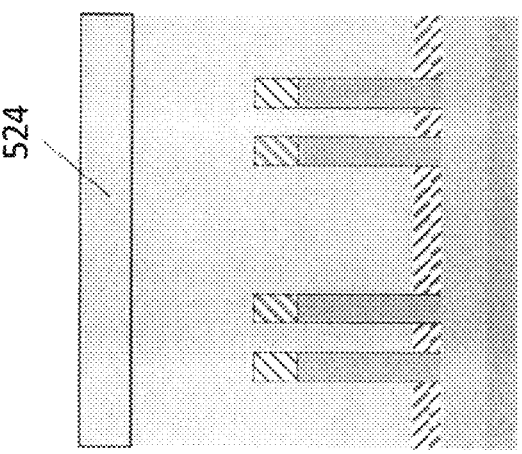
FIG. 13B illustrates a side view of the forming of a cut portion 526c in a photoresist layer 526 along line B-B in FIG. 13A, according to an exemplary aspect of the present invention.
Figure 13A:
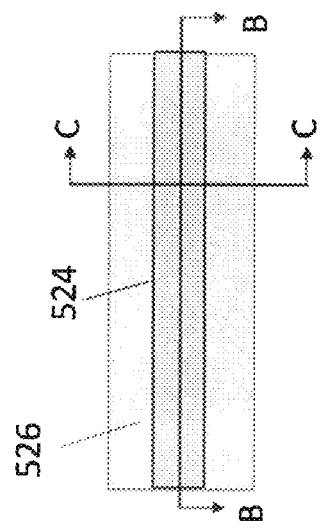
FIG. 13A illustrates a top view of the forming of a cut portion 526c in a photoresist layer 526, according to an exemplary aspect of the present invention.

FIG. 13A illustrates a top view of the forming of a cut portion 526c in a photoresist layer 526, according to an exemplary aspect of the present invention. FIG. 13B illustrates a side view of the forming of a cut portion 526c in a photoresist layer 526 along line B-B in FIG. 13A, according to an exemplary aspect of the present invention. FIG. 13C illustrates a side view of the forming of a cut portion 526c in a photoresist layer 526 along line C-C in FIG. 13A, according to an exemplary aspect of the present invention.

As illustrated in FIG. 13C, an organic planarization layer (OPL) 522 may be formed on the bottom spacer 520 and the fin structure 506a including the hard mask portion 508a, and may have a thickness which is greater than a total thickness of the fin structure 506a and hard mask portion 508a.

The organic planarization layer (OPL) may include a photo-sensitive organic polymer comprising a light-sensitive material that, when exposed to electromagnetic (EM) radiation, is chemically altered and thus configured to be removed using a developing solvent. For example, the photo-sensitive organic polymer of the OPL may be include polyacrylate resin, epoxy resin, phenol resin, polyamide resin, polyimide resin, unsaturated polyester resin, polyphenylether resin, polyphenylenesulfide resin, and/or benzocyclobutene (BCB). More generally, for example, the OPL may include any organic polymer and a photo-active compound having a molecular structure that can attach to the molecular structure of the organic polymer. The OPL may, for example, be applied using spin coating technology or other techniques.

An antireflective coating layer 524 may be formed on the OPL 522. The antireflective coating layer 524 may include a light-sensitive material that, when exposed to electromagnetic (EM) radiation, is chemically altered and thus configured to be removed using a developing solvent (e.g., a wet developable antireflective coating). The antireflective coating layer 524 may, for example, be formed using spin coating technology.

The photoresist layer 526 may be formed on the antireflective coating layer 524, and the cut portion 526c may be formed in the photoresist layer 526 by patterning (e.g., lithography). The cut portion 526c may have a width Wc which is substantially equal to a desired width Wr of a recess in the fin structure 506a (e.g., see FIG. 2B). The forming of the cut portion 526c may expose an upper surface of the antireflective coating 524.

Figure 14C:
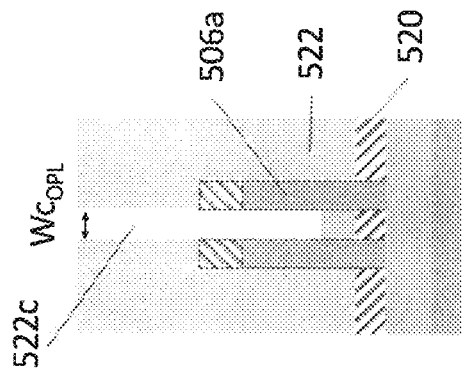
FIG. 14C illustrates a side view of the partial etch of the OPL 522 along line C-C in FIG. 14A, according to an exemplary aspect of the present invention.
Figure 14B:
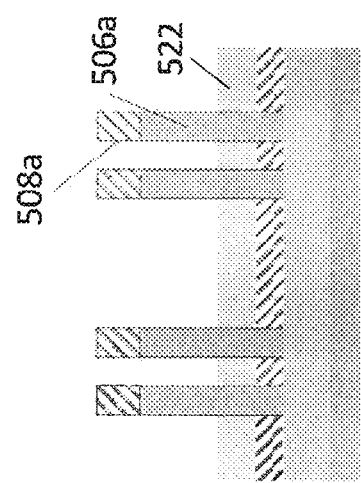
FIG. 14B illustrates a side view of the partial etch of the OPL 522 along line B-B in FIG. 14A, according to an exemplary aspect of the present invention.
Figure 14A:
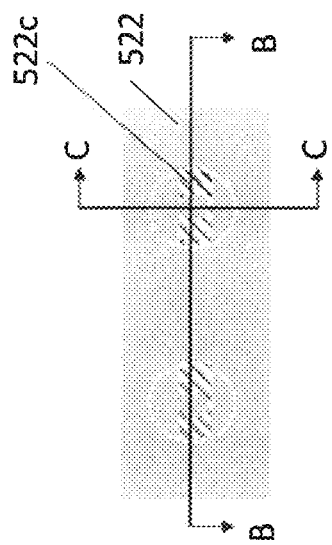
FIG. 14A illustrates a top view of the partial etch of an organic planarization layer (OPL) 522, according to an exemplary aspect of the present invention.

FIG. 14A illustrates a top view of the partial etch of the OPL 522, according to an exemplary aspect of the present invention. FIG. 14B illustrates a side view of the partial etch of the OPL 522 along line B-B in FIG. 14A, according to an exemplary aspect of the present invention. FIG. 14C illustrates a side view of the partial etch of the OPL 522 along line C-C in FIG. 14A, according to an exemplary aspect of the present invention.

The OPL 522 may be partially cut (e.g., etched) in order to form a cut portion 522c of the OPL 522. The cut portion 522c may have a width $Wc_{OPL}$ corresponding to the width Wc of the cut portion 526c (e.g., substantially equal to a desired width Wr of a recess in the fin structure 506a). A depth of the cut portion 522c should be deep enough to expose part of the hard mask portion 508a and a sidewall of the fin structure 506a, but not so deep as to expose a surface of the bottom spacer 520.

FIG. 15A illustrates a top view of the forming of a cut portion 506ac of the fin structure 506a in an upper surface of the fin structure 506a, according to an exemplary aspect of the present invention. FIG. 15B illustrates a side view of the forming of a cut portion 506ac in an upper surface of the fin structure 506a along line B-B in FIG. 15A, according to an exemplary aspect of the present invention. FIG. 15C illustrates a side view of the forming of a cut portion 506ac in an upper surface of the fin structure 506a along line C-C in FIG. 15A, according to an exemplary aspect of the present invention.

The cut portion 506ac may correspond to the cut portion 522c of the OPL 522, and may correspond to a recess 115 in the fin structure 110 (see FIGS. 1 and 2B). The cut portion 506ac may be formed, for example, by etching, and may remove the exposed part of the hard mask portion 508a, and a part of the fin structure 506a which is under the cut portion 522c of the OPL 522. A depth of the cut portion 506ac may be in a range from 10 nm to 90 nm. That is, as illustrated in FIGS. 15B-15C, a difference $H_{diff}$ between an upper surface of the fin structure 506a at the cut portion 506ac, and an upper surface of the remainder of the fin structure 506a may be in a range from 10 nm to 90 nm.

Figure 16C:
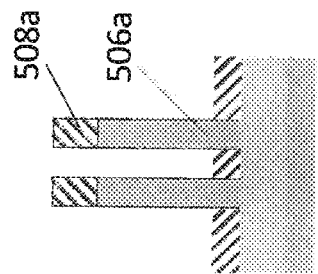
FIG. 16C illustrates a side view of the removal (e.g., stripping) of the OPL 522 along line C-C in FIG. 16A, according to an exemplary aspect of the present invention.
Figure 16B:
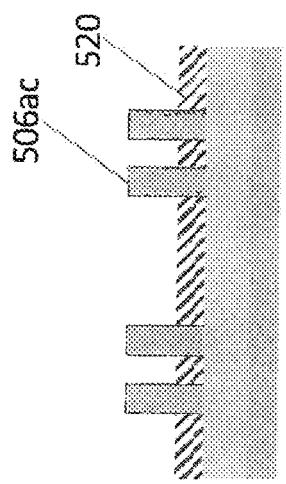
FIG. 16B illustrates a side view of the removal (e.g., stripping) of the OPL 522 along line B-B in FIG. 16A, according to an exemplary aspect of the present invention.
Figure 16A:
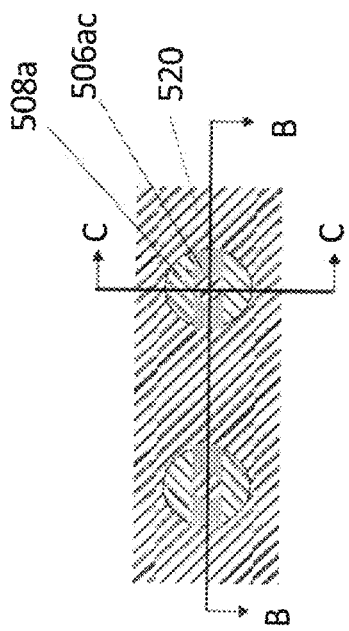
FIG. 16A illustrates a top view of the removal (e.g., stripping) of the OPL 522, according to an exemplary aspect of the present invention.

FIG. 16A illustrates a top view of the removal (e.g., stripping) of the OPL 522, according to an exemplary aspect of the present invention. FIG. 16B illustrates a side view of the removal (e.g., stripping) of the OPL 522 along line B-B in FIG. 16A, according to an exemplary aspect of the present invention. FIG. 16C illustrates a side view of the removal (e.g., stripping) of the OPL 522 along line C-C in FIG. 16A, according to an exemplary aspect of the present invention.

The OPL 522 may be removed (e.g., stripped), for example, by etching, to expose the remaining hard mask portion 508a, the cut portion 506ac and the bottom spacer 520.

FIG. 17 illustrates the resulting fin structure 506a, according to an exemplary aspect of the present invention. The hard mask portion 508a is not illustrated in FIG. 17 for clarity. The fin structure 506a may have dimensions which correspond to the dimensions of the fin structure 110 in FIG. 2B, and the cut portion 506ac may have dimensions which correspond to the dimensions of the recess 115 in FIG. 2B.

Figure 18C:
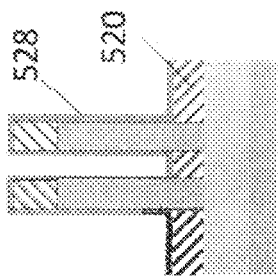
FIG. 18C illustrates a side view of the forming of the WFM layer 528 along line C-C in FIG. 18A, according to an exemplary aspect of the present invention.
Figure 18B:
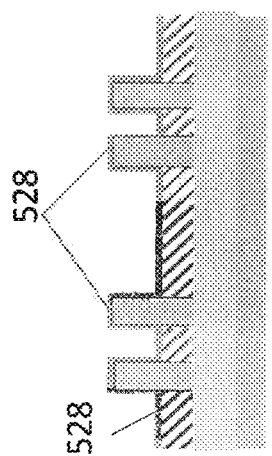
FIG. 18B illustrates a side view of the forming of the WFM layer 528 along line B-B in FIG. 18A, according to an exemplary aspect of the present invention.
Figure 18A:
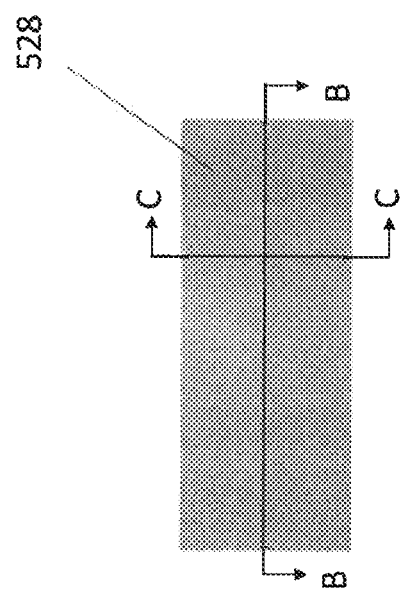
FIG. 18A illustrates a top view of the forming (e.g., deposition) of a work function metal (WFM) layer 528, according to an exemplary aspect of the present invention.

FIG. 18A illustrates a top view of the forming (e.g., deposition) of a work function metal (WFM) layer 528, according to an exemplary aspect of the present invention. FIG. 18B illustrates a side view of the forming of the WFM layer 528 along line B-B in FIG. 18A, according to an exemplary aspect of the present invention. FIG. 18C illustrates a side view of the forming of the WFM layer 528 along line C-C in FIG. 18A, according to an exemplary aspect of the present invention.

The WFM layer 528 may have a thickness in a range from 2 nm to 7 nm include an n-type WFM or p-type WFM. The type of WFM to be used may depend on the type of transistor and may differ between the type of FET device. For example, a p-type WFM may include compositions such as ruthenium, palladium, platinum, cobalt, nickel, and conductive metal oxides, or any combination thereof. An n-type WFM may include compositions such as hafnium, zirconium, titanium, tantalum, aluminum, metal carbides (e.g., hafnium carbide, zirconium carbide, titanium carbide, and aluminum carbide), aluminides, or any combination thereof.

Figure 19C:
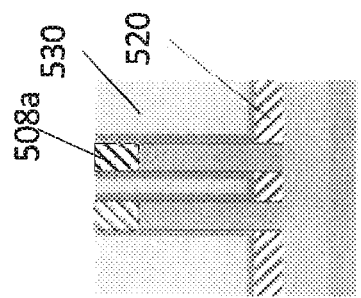
FIG. 19C illustrates a side view of the forming of a gate metal layer 530 along line C-C in FIG. 19A, according to an exemplary aspect of the present invention.
Figure 19B:
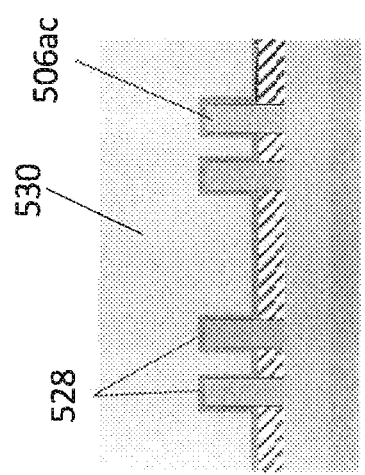
FIG. 19B illustrates a side view of the forming of a gate metal layer 530 along line B-B in FIG. 19A, according to an exemplary aspect of the present invention.
Figure 19A:
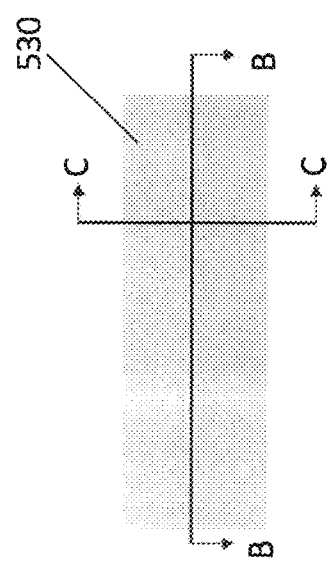
FIG. 19A illustrates a top view of the forming of a gate metal layer 530, according to an exemplary aspect of the present invention.

FIG. 19A illustrates a top view of the forming of a gate metal layer 530, according to an exemplary aspect of the present invention. FIG. 19B illustrates a side view of the forming of a gate metal layer 530 along line B-B in FIG. 19A, according to an exemplary aspect of the present invention. FIG. 19C illustrates a side view of the forming of a gate metal layer 530 along line C-C in FIG. 19A, according to an exemplary aspect of the present invention.

The gate metal layer 530 may include one or more conductive material including aluminum, silver, gold, copper, tungsten or an alloy of any of these materials. The gate metal layer 530 may be formed so as to cover the bottom spacer 520 and the cut portion 506ac of the fin structure 506c. An upper surface of the gate metal layer 530 may be planarized (e.g., by chemical mechanical polishing (CMP)) to be substantially co-planar with an upper surface of the hard mask portion 508a.

Figure 20C:
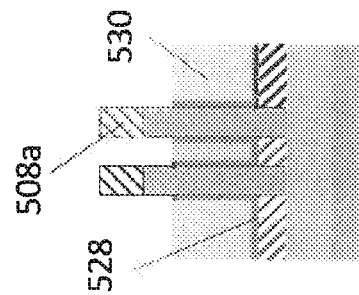
FIG. 20C illustrates a side view of the recessing of the gate metal layer 530 along line C-C in FIG. 20A, according to an exemplary aspect of the present invention.
Figure 20B:
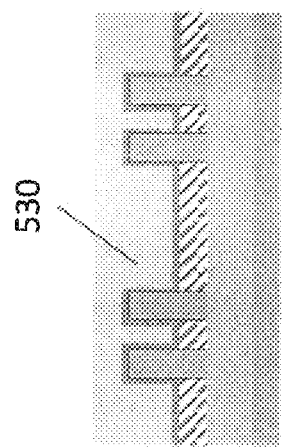
FIG. 20B illustrates a side view of the recessing of the gate metal layer 530 along line B-B in FIG. 20A, according to an exemplary aspect of the present invention.
Figure 20A:
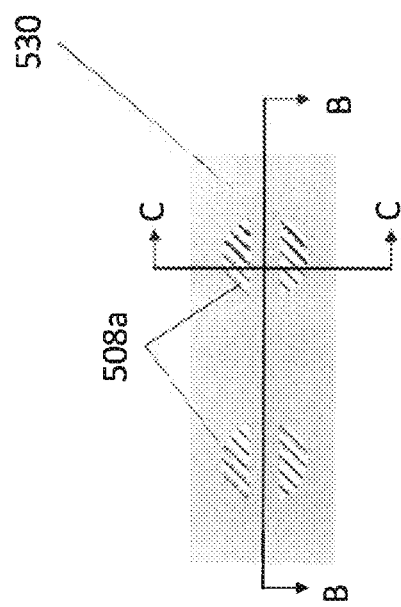
FIG. 20A illustrates a top view of a recessing of the gate metal layer 530 of the present invention.

FIG. 20A illustrates a top view of a recessing of the gate metal layer 530, according to an exemplary aspect of the present invention. FIG. 20B illustrates a side view of the recessing of the gate metal layer 530 along line B-B in FIG. 20A, according to an exemplary aspect of the present invention. FIG. 20C illustrates a side view of the recessing of the gate metal layer 530 along line C-C in FIG. 20A, according to an exemplary aspect of the present invention.

The gate metal layer 530 may be recessed, for example, by etching, and may expose the hard mask portion 508a. As illustrated in FIG. 20C, the WFM layer 528 on the hard mask portion 508a and on the fin structure 506a may also be recessed so as to have an upper surface which is substantially co-planar with an upper surface of the recessed gate metal layer 530.

Figure 21C:
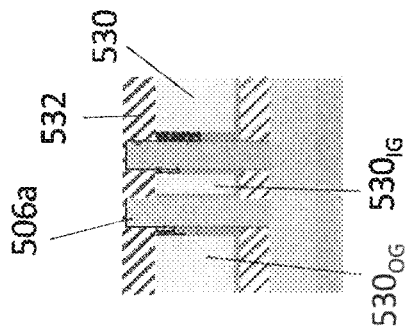
FIG. 21C illustrates a side view of the removal of the hard mask portion 508a and forming of a top spacer layer 532 along line C-C in FIG. 21A, according to an exemplary aspect of the present invention.
Figure 21B:
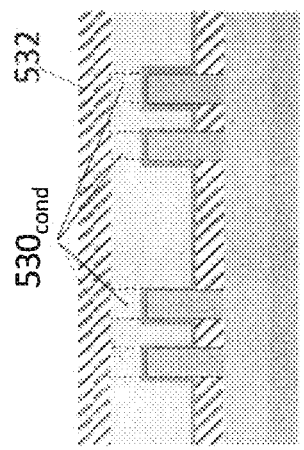
FIG. 21B illustrates a side view of the removal of the hard mask portion 508a and forming of a top spacer layer 532 along line B-B in FIG. 21A, according to an exemplary aspect of the present invention.
Figure 21A:
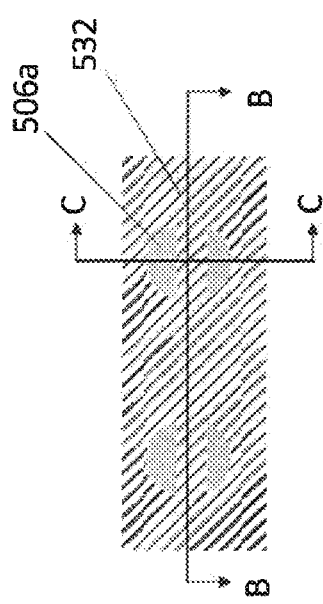
FIG. 21A illustrates a top view of the removal of the hard mask portion 508a and forming of a top spacer layer 532, according to an exemplary aspect of the present invention.

FIG. 21A illustrates a top view of the removal of the hard mask portion 508a and forming of a top spacer layer 532, according to an exemplary aspect of the present invention. FIG. 21B illustrates a side view of the removal of the hard mask portion 508a and forming of a top spacer layer 532 along line B-B in FIG. 21A, according to an exemplary aspect of the present invention. FIG. 21C illustrates a side view of the removal of the hard mask portion 508a and forming of a top spacer layer 532 along line C-C in FIG. 21A, according to an exemplary aspect of the present invention.

The hard mask portion 508a may be removed, for example, by etching, and the top spacer layer 532 may be formed, for example, by deposition on the gate metal layer 530. As illustrated in FIG. 21C, the top spacer layer 532 may be planarized so that an upper surface of the top spacer layer 532 may be co-planar with an upper surface of the fin structure 506a.

Further, FIG. 21B illustrates the portion $530_{cond}$ of the gate metal layer 530 which corresponds to the conductor 140 in FIGS. 1-2B, and the inner gate portion $530_{IG}$ and outer gate portion $530_{OG}$ of the gate metal layer 530 which correspond to the inner and outer gates 120, 130 in FIGS. 1 and 2B, respectively.

Figure 22C:
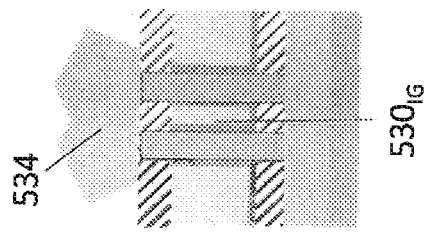
FIG. 22C illustrates a side view of the forming of the top source/drain layer 534 along line C-C in FIG. 22A, according to an exemplary aspect of the present invention.
Figure 22B:
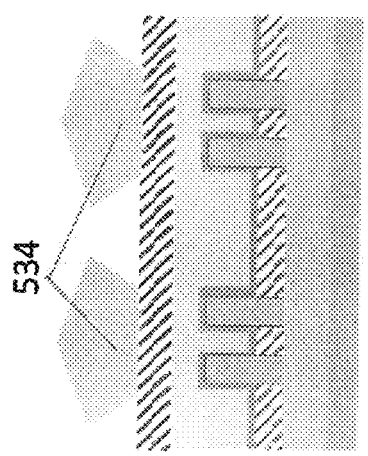
FIG. 22B illustrates a side view of the forming of the top source/drain layer 534 along line B-B in FIG. 22A, according to an exemplary aspect of the present invention.
Figure 22A:
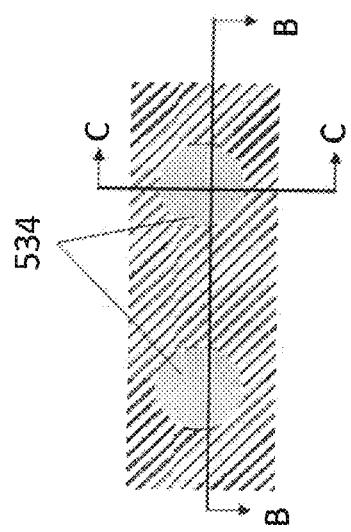
FIG. 22A illustrates a top view of the forming of the top source/drain layer 534, according to an exemplary aspect of the present invention.

FIG. 22A illustrates a top view of the forming of the top source/drain layer 534, according to an exemplary aspect of the present invention. FIG. 22B illustrates a side view of the forming of the top source/drain layer 534 along line B-B in FIG. 22A, according to an exemplary aspect of the present invention. FIG. 22C illustrates a side view of the forming of the top source/drain layer 534 along line C-C in FIG. 22A, according to an exemplary aspect of the present invention.

The top source/drain layer 534 may be formed, for example, by epitaxial growth from the top surface of the fin structure 506a. As illustrated in FIG. 22C, as the top source/drain layer 534 is epitaxially grown, the grown portions may merge over the inner gate portion $530_{IG}$ of the gate metal layer 530.

For example, the top source/drain layer 534 may be epitaxially grown by chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The top source/drain layer 534 may include, for example, silicon, germanium, or silicon germanium.

A number of different sources may be used for the deposition of the top source/drain layer 534. In some embodiments, the gas source for the deposition of epitaxial semiconductor material include a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 23C:
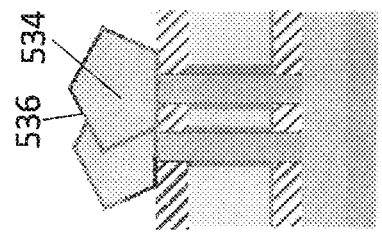
FIG. 23C illustrates a side view of the forming of the encapsulation layer 536 along line C-C in FIG. 23A, according to an exemplary aspect of the present invention.
Figure 23B:
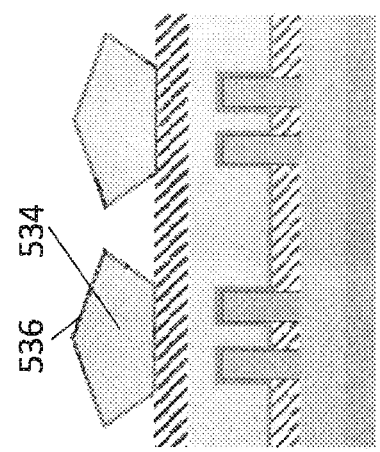
FIG. 23B illustrates a side view of the forming of the encapsulation layer 536 along line B-B in FIG. 23A, according to an exemplary aspect of the present invention.
Figure 23A:
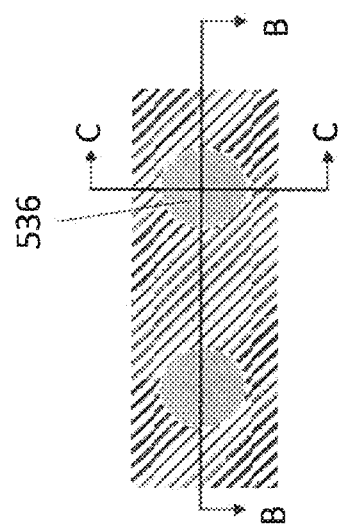
FIG. 23A illustrates a top view of the forming of an encapsulation layer 536 (e.g., top encapsulation layer), according to an exemplary aspect of the present invention.

FIG. 23A illustrates a top view of the forming of an encapsulation layer 536 (e.g., top encapsulation layer), according to an exemplary aspect of the present invention. FIG. 23B illustrates a side view of the forming of the encapsulation layer 536 along line B-B in FIG. 23A, according to an exemplary aspect of the present invention. FIG. 23C illustrates a side view of the forming of the encapsulation layer 536 along line C-C in FIG. 23A, according to an exemplary aspect of the present invention.

The encapsulation layer 536 may be formed on and encapsulate the top source/drain layer 534.

Figure 24C:
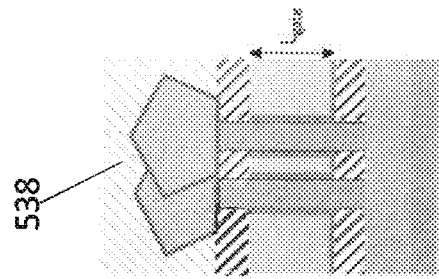
FIG. 24C illustrates a side view of the forming of the interlayer dielectric (ILD) 538 along line C-C in FIG. 24A, according to an exemplary aspect of the present invention.
Figure 24B:
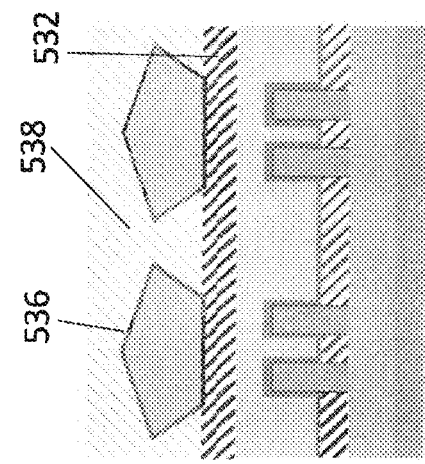
FIG. 24B illustrates a side view of the forming of the interlayer dielectric (ILD) 538 along line B-B in FIG. 24A, according to an exemplary aspect of the present invention.
Figure 24A:
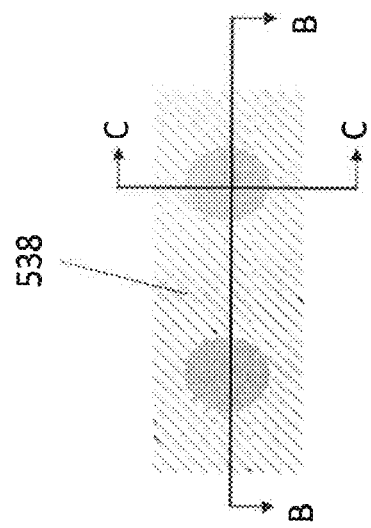
FIG. 24A illustrates a top view of the forming of an interlayer dielectric (ILD) 538, according to an exemplary aspect of the present invention.

FIG. 24A illustrates a top view of the forming of an interlayer dielectric (ILD) 538, according to an exemplary aspect of the present invention. FIG. 24B illustrates a side view of the forming of the interlayer dielectric (ILD) 538 along line B-B in FIG. 24A, according to an exemplary aspect of the present invention. FIG. 24C illustrates a side view of the forming of the interlayer dielectric (ILD) 538 along line C-C in FIG. 24A, according to an exemplary aspect of the present invention.

The ILD 538 may be formed on the encapsulation layer 536 and the top spacer layer 532, and then polished (e.g., by CMP). The ILD 538 may include, for example, silicon dioxide, silicon nitride, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, borophosphosilicate glass (BPSG) or spin-on-glass.

FIG. 24C also illustrates a gate length ($L_{gate}$) of the resulting VFET.

With its unique and novel features, the exemplary aspects of the present invention may provide a merging of the inner and outer gates, and eliminate the need for separate contacts for the inner and outer gates.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device comprising:
    a fin structure including a recess formed in an upper surface of the fin structure;
    a conductor formed in an upper surface of the fin structure;
    an inner gate formed in the recess of the fin structure; and
    an outer gate formed outside and around the fin structure.

2. The semiconductor device of claim 1, wherein the fin structure includes the recess formed in the upper surface of the fin structure.

3. The semiconductor device of claim 1, wherein the conductor is formed in the recess.

4. The semiconductor device of claim 1, wherein the conductor includes a conductive bar extending radially across the fin structure from an inner surface of the fin structure to an outer surface of the fin structure.

5. The semiconductor device of claim 1, further comprising a conductive bar that includes a first end connected to an outer surface of the inner gate and a second end connected to an inner surface of the outer gate.

6. The semiconductor device of claim 1, further comprising an inner gate insulating layer formed between the inner gate and an inner surface of the fin structure.

7. A semiconductor device comprising:
    a substrate;
    a fin structure with a recess formed on the substrate; and
    a conductor formed as a conductive bar that radially extends across the fin structure from an inner surface of the fin structure within the recess to an outer surface of the fin structure,
    wherein the conductive bar includes a first end connected to an outer surface of an inner gate and a second end connected to an inner surface of an outer gate.

8. The semiconductor device of claim 7, wherein the fin structure includes the recess formed in an upper surface of the fin structure.

9. The semiconductor device of claim 7, wherein the conductor is formed in an upper surface of the fin structure.

10. The semiconductor device of claim 7, wherein the conductor is formed in the recess.

11. The semiconductor device of claim 7, further comprising an inner gate insulating layer formed between the inner gate and the inner surface of the fin structure.

12. A vertical field effect transistor comprising:
    a substrate;
    a source-drain layer formed on the substrate;
    a fin structure formed from a channel layer on the source-drain layer;
    a conductor formed in a recess of the fin structure; and
    a gate layer formed from inside to outside of the fin structure.

13. The vertical field effect transistor of claim 12, wherein the fin structure includes a recess formed in an upper surface of the fin structure.

14. The vertical field effect transistor of claim 12, wherein the conductor is formed in an upper surface of the fin structure.

15. The vertical field effect transistor of claim 12, further comprising a conductor that includes a conductive bar extending radially across the fin structure from an inner surface of the fin structure to an outer surface of the fin structure.

16. The vertical field effect transistor of claim 12, further comprising:
    a conductive bar that includes a first end connected to an outer surface of an inner gate part of the gate layer and a second end connected to an inner surface of an outer gate part of the gate layer; and
    an inner gate insulating layer formed between an inner part of the gate layer and the inner surface of the fin structure.

* * * * *